(12) United States Patent
Lavie et al.

(10) Patent No.: US 9,943,006 B2
(45) Date of Patent: Apr. 10, 2018

(54) CABINET FOR ELECTRONIC EQUIPMENT

(71) Applicant: TELEFONAKTIEBOLAGET LM ERICSSON (PUBL), Stockholm (SE)

(72) Inventors: Fabien Lavie, Arpajon (FR); Francis Bizon-Samos, Aulnay-sous-Bois (FR); Matthias Rodermann, Versailles (FR)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 15/111,705

(22) PCT Filed: Jan. 12, 2015

(86) PCT No.: PCT/SE2015/050011
§ 371 (c)(1),
(2) Date: Jul. 14, 2016

(87) PCT Pub. No.: WO2015/108467
PCT Pub. Date: Jul. 23, 2015

(65) Prior Publication Data
US 2016/0353604 A1 Dec. 1, 2016

Related U.S. Application Data

(60) Provisional application No. 61/928,777, filed on Jan. 17, 2014.

(51) Int. Cl.
*H05K 7/18* (2006.01)
*H05K 7/20* (2006.01)
(Continued)

(52) U.S. Cl.
CPC ............... *H05K 7/186* (2013.01); *H04B 1/38* (2013.01); *H05K 7/20145* (2013.01);
(Continued)

(58) Field of Classification Search
CPC ......... H01L 2924/0002; H01L 2924/00; H01L 23/576; H01L 23/473; H01L 21/68735; H01L 23/4735; H05K 7/20736; H05K 7/20745; H05K 7/20145; H05K 7/20572; H05K 7/1497; H05K 7/20172; H05K 7/20727; H05K 1/14; H05K 7/20836;
(Continued)

(56) References Cited

U.S. PATENT DOCUMENTS 2,459,322 A * 1/1949 Johnston ................. H01F 30/10
174/16.1
3,587,557 A * 6/1971 Henderson ............ F24C 14/025
126/21 A
(Continued)

FOREIGN PATENT DOCUMENTS

EP 1307082 A2 5/2003

*Primary Examiner* — Adam B Dravininkas

(57) ABSTRACT

A cabinet for housing electronic equipment such as radio base station transceivers. The cabinet has one opening comprising at least one inlet section and at least one outlet section, a fan assembly and a baffle assembly arranged to force and direct an incoming air flow entering through the inlet section of the opening of the cabinet so it can pass through an electronic component storage area housing the electronic equipment and exit through the outlet section of the same opening in the cabinet.

4 Claims, 5 Drawing Sheets

(51) Int. Cl.
*H04B 1/38* (2015.01)
*H04B 1/036* (2006.01)
*H04B 1/08* (2006.01)
*H04W 88/08* (2009.01)

(52) U.S. Cl.
CPC ..... H05K 7/20572 (2013.01); H05K 7/20718 (2013.01); *H04B 1/036* (2013.01); *H04B 1/08* (2013.01); *H04W 88/08* (2013.01)

(58) Field of Classification Search
CPC .............. H05K 1/189; H05K 7/20554; H05K 7/20163; H05K 7/20; H05K 7/20209; H05K 5/03; H05K 7/20154; H05K 7/20181; H05K 1/0203; H05K 7/186; H05K 7/2039; H05K 7/20763; H05K 7/2079; H05K 7/20136; H05K 7/20718; H05K 7/20754; H05K 7/206; H05K 7/20781; H04B 1/38; H04B 1/08; H04B 1/036; H04W 88/08
See application file for complete search history.

(56) References Cited

U.S. PATENT DOCUMENTS

| | | | | |
|---|---|---|---|---|
| 3,882,843 | A * | 5/1975 | Barnett | F24C 14/02 126/21 A |
| 4,601,279 | A * | 7/1986 | Guerin | F24C 14/02 126/21 A |
| 4,665,466 | A * | 5/1987 | Green | H05K 7/206 174/16.1 |
| 5,424,915 | A * | 6/1995 | Katooka | H05K 7/20909 361/695 |
| 5,490,830 | A * | 2/1996 | Lovelady | B04B 5/0421 494/14 |
| 2002/0191374 | A1* | 12/2002 | Yatougo | H05K 7/20145 361/690 |
| 2007/0144704 | A1* | 6/2007 | Bundza | H05K 7/206 165/48.1 |
| 2009/0310301 | A1* | 12/2009 | Nelson | H05K 7/20163 361/695 |
| 2010/0311316 | A1 | 12/2010 | Tindale et al. | |

* cited by examiner

WITH EXTERNAL BAFFLES/REFLECTORS

WITHOUT EXTERNAL BAFFLES/REFLECTORS

CABINET FOR ELECTRONIC EQUIPMENT

This application is a 371 of International Application No. PCT/SE2015/050011, filed Jan. 12, 2015, which claims the benefit of U.S. Application No. 61/928,777, filed Jan. 17, 2014, the disclosures of which are fully incorporated herein by reference.

TECHNICAL FIELD

The application relates to a cabinet for housing electronic equipment such as radio base station transceivers.

BACKGROUND

Electronic equipment like base station transceivers, servers and routers are normally rack mounted in cabinets when in operation. To cope with the heat dissipation from the electronic circuits, cooling of the equipment is necessary. The heat can be transported from the electronic equipment by using air or a fluid and natural convection cooling or forced cooling. Natural air convection cooling is based on the motion caused by the density differences in the air due to a temperature difference. A gas expands when heated and becomes less dense. In a gravitational field, this lighter gas rises and initiates a motion in the gas called natural convection currents. Forced cooling on the other hand involves additional cooling equipment such as fans for increasing the motion of the air flow.

Cabinets using air cooling are often provided with openings in order to allow cooler air outside the cabinet to pass through the cabinet as to cool the electronic equipment. An example is shown in US patent application 2010/0311316 wherein an enclosure 121 for electronic equipment is illustrated having an air inlet vent 122 in the lower part of the enclosure to allow air 123 to enter the enclosure, and a further air vent 124 at the upper part to allow air to exit the enclosure.

The air flow can be forced by fans within the cabinet or by external fans as illustrated in said application. The cabinet shown in US patent application 2010/0311316 is located in an indoor environment.

A disadvantage of using this type of cabinet in an outdoor environment is the increased risk for contamination of the electronic equipment located within the cabinet. Another disadvantage is that the interior can become too cold during very cold weather conditions which mean that additional heater equipment is needed in order to keep the temperature within the specified operational range.

SUMMARY

With this background it is the object of the embodiments described below to obviate at least some of the disadvantages mentioned above.

The object is achieved by a thermal management cabinet for electronic equipment, comprising a cabinet frame having side walls and defining a front, a back, a top and a bottom, the cabinet forming a generally sealed enclosure for electronic equipment; an electronic component storage area including at least one rack mounting assembly for supporting electronic equipment in an interior section of the cabinet; one opening in the cabinet comprising at least one inlet section and at least one outlet section; a fan assembly and a baffle assembly arranged to force and direct an incoming air flow entering through the inlet section of the opening of the cabinet so it can pass through the electronic component storage area and exit through the outlet section of the same opening in the cabinet.

The cabinet may also comprise two elongated and adjacent compartments, the first one for guiding an upward air flow and the second one for guiding an downward air flow.

Apart from improved cooling, an advantage with this solution is that a single opening reduces dust contamination of the electronic equipment, especially for outdoor locations (such as sites for base stations). Another advantage is that the relatively longer way for the air flow to travel within the cabinet reduces noise from the fan assembly. Yet another advantage for outdoor locations is that the solution allows for passive heating when the outdoor temperature gets very low.

DETAILED DESCRIPTION

Figure 1:
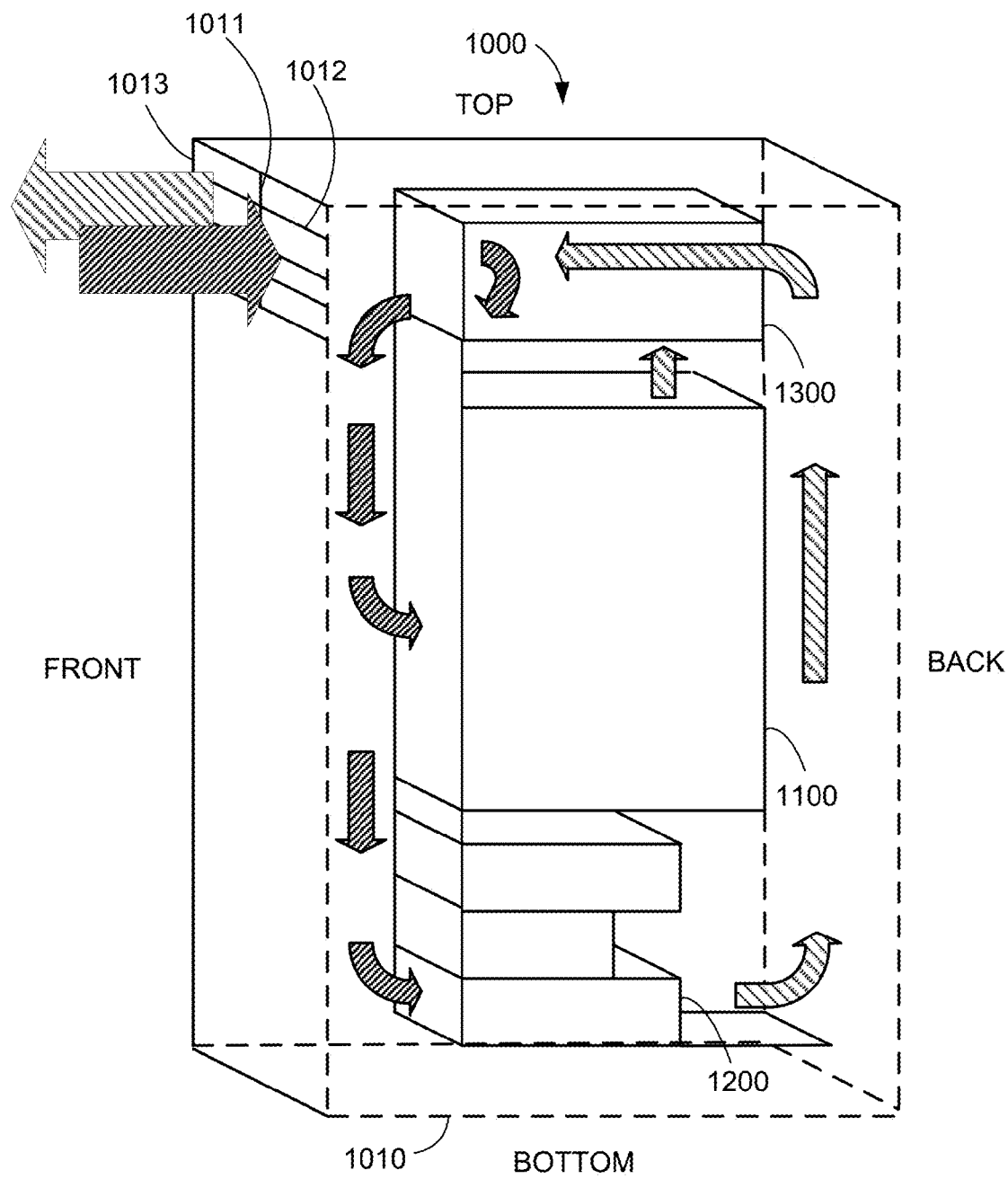
FIG. 1 illustrates an embodiment with one inlet air flow and one outlet air flow through the same opening.

FIG. 1 illustrates an embodiment 1000 of an improvement of prior art with one opening 1011 in the upper part of the cabinet 1010 comprising one inlet section 1012 and one outlet section 1013. The embodiment 1000 is arranged to allow for one incoming air flow entering the cabinet and one outgoing air flow leaving the cabinet through the same opening. The cabinet 1010 comprises a frame having side walls and defining a front, a back, a top and a bottom. The cabinet comprises an electronic component storage area 1100 including at least one rack mounting assembly for supporting electronic equipment inside the cabinet 1010. The electronic equipment in the electronic component storage area 1100 in FIG. 1 could for example be a radio base station transceiver. The cabinet further comprises a fan assembly 1200 (here located under the electronic equipment) which may comprise one or more fans. The fan assembly 1200 is arranged to force the incoming air flow entering through the inlet section 1012 of the opening 1011 to pass through the electronic component storage area 1100 and to exit as the outgoing air flow through the outlet section 1013 of the same opening 1011 in the cabinet 1010. The cabinet also includes a baffle assembly 1300 (including baffles/deflectors, preferably being metal plates) arranged to separate the incoming and outgoing air flows in paths as illustrated by the arrows in FIG. 1.

In FIG. 1 the forced air flow leaving the fan assembly 1200 is directed upwards within the cabinet 1010. Due to the resulting lower air pressure at the inlet section 1012 of the opening 1011 in the upper part of the cabinet 1010, the incoming air flow is guided downwards in front of and through the electronic equipment 1100 before it enters through the fan assembly 1200. The opening 1011 is optionally provided with an external baffle mounted on the outside of the cabinet 1010 separating the inlet 1012 and outlet 1013 section.

Figure 2:
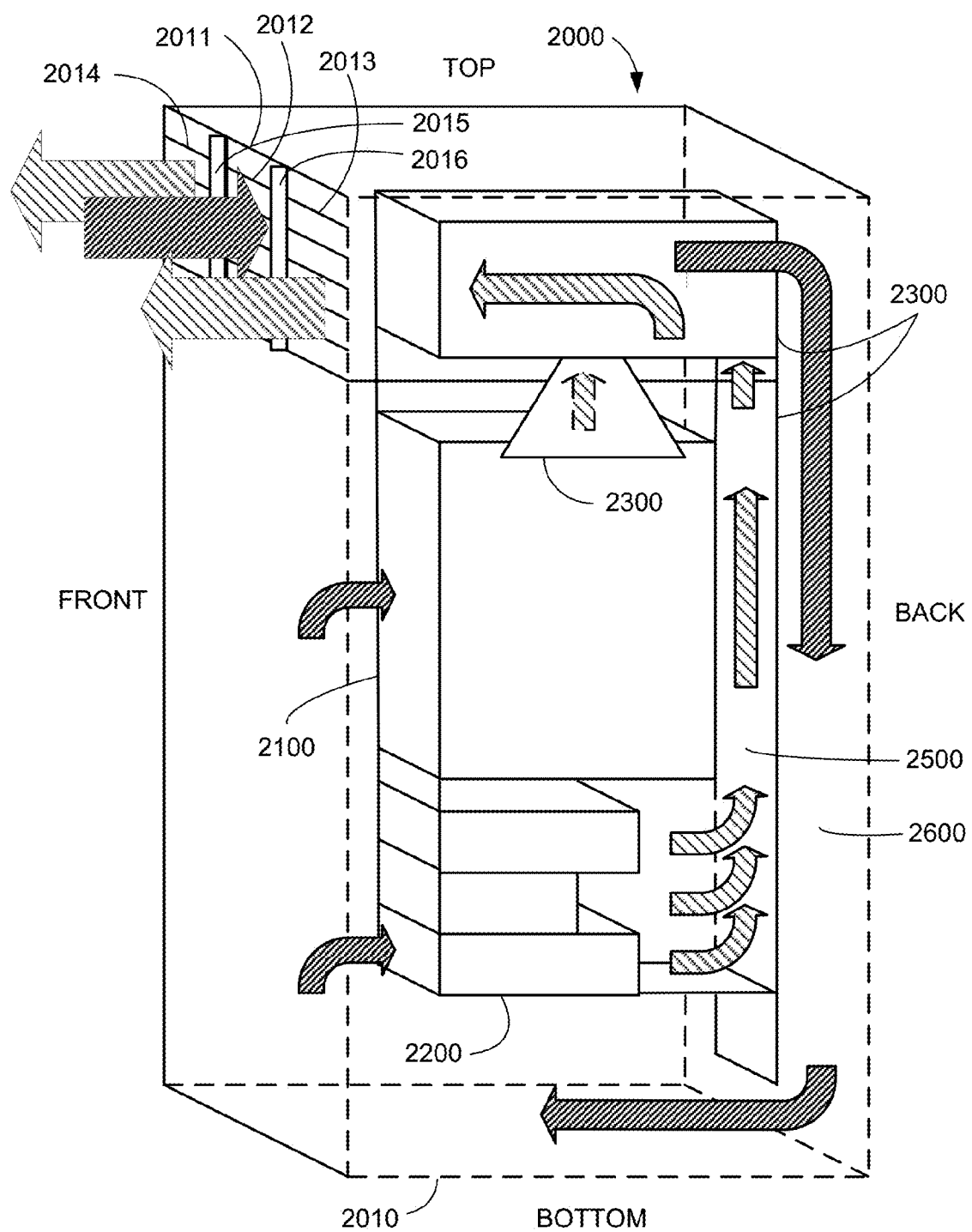
FIGS. 2, 3A and 3B illustrate an embodiment with one incoming air flow and two outgoing air flows through the same opening.

FIG. 2 illustrates a preferred embodiment 2000 that is arranged to allow for one incoming air flow to enter the cabinet 2010 and two outgoing air flows to leave the cabinet through the same opening 2011 having one inlet section 2012 and two outlet sections 2013,2014. In FIG. 2 the cabinet 2010 is further arranged so that the forced air flow leaving the fan assembly 2200 is directed upwards in a first elongated compartment 2500 behind the electronic equipment and divided into two air flows by baffles 2300 so that each one of the resulting two air flows can be directed through one dedicated outlet section 2013,2014 of the opening 2011.

The cabinet 2010 is further arranged so that the incoming air flow is directed downwards through a second elongated compartment 2600 adjacent to the first compartment 2500 and in the back of the cabinet 2010 and behind the first compartment 2500 so that the air flow is directed under and through the electronic equipment 2100 and the fan assembly 2200. The opening 2011 is further provided with two baffles 2015,2016 mounted on the outside of the cabinet 2010 separating the inlet section 2012 from the two outlet sections 2013,2014.

An advantage with this embodiment 2000 when used in a very cold outdoor environment is that the air flow passing the second compartment 2600 becomes preheated which means that the temperature difference between the electronic circuits and the incoming air flow is reduced resulting in an air flow having a temperature that is within the allowed range specified for cooling electronic equipment. Another advantage is that the use of the second compartment 2600 contributes to the reduction of dust contaminating the electronics as this dust will be collected at the bottom of the cabinet.

Figure 3A:
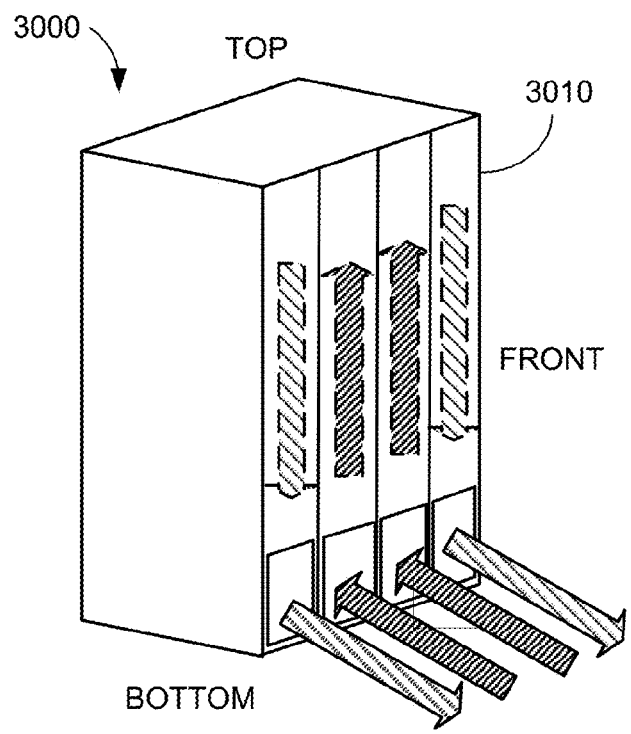
Figure 3B:
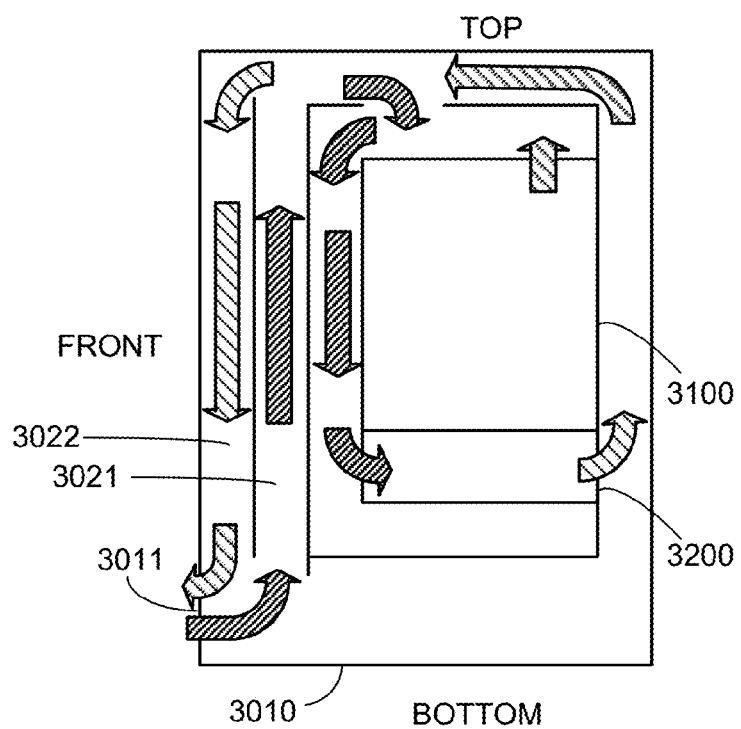

FIGS. 3A and 3B illustrate an embodiment 3000 with a similar principle as the embodiment in FIG. 2, but here the opening is located in lower part of the cabinet. The opening 3011 has one inlet section and two outlet sections.

In FIGS. 3A and 3B the cabinet 3010 is arranged so that the incoming air flow is directed upwards through a first elongated compartment 3021 and then directed downwards again in front of the electronic equipment 3100 and through the fan assembly 3200. The forced air flow leaving the fan assembly 3200 is directed upwards behind, through and above the electronic equipment 3100 and then directed downwards again towards the opening 3011 through a second elongated compartment 3022 adjacent to the first compartment 3021 and in the front of the cabinet 3010.

Although the incoming air flow is illustrated as two air flows in FIG. 3A they are treated as one incoming air flow that is divided into two outgoing airflows using baffles according to the same principle as used in the embodiment 2000 illustrated in FIG. 2.

A feature common to the embodiments 1000,2000,3000 apart from the single opening 1011,2011,3011 is that the air flow travels a relatively long way within the cabinet 1010, 2010,3010. This reduces noise from the fan assembly 1200, 2200,3200 but does also allow for pre-heating/passive heating of the incoming air flow. As no extra heating equipment is necessary, the volume for the air flow can be increased without increasing the size of the cabinet.

Figure 4A:
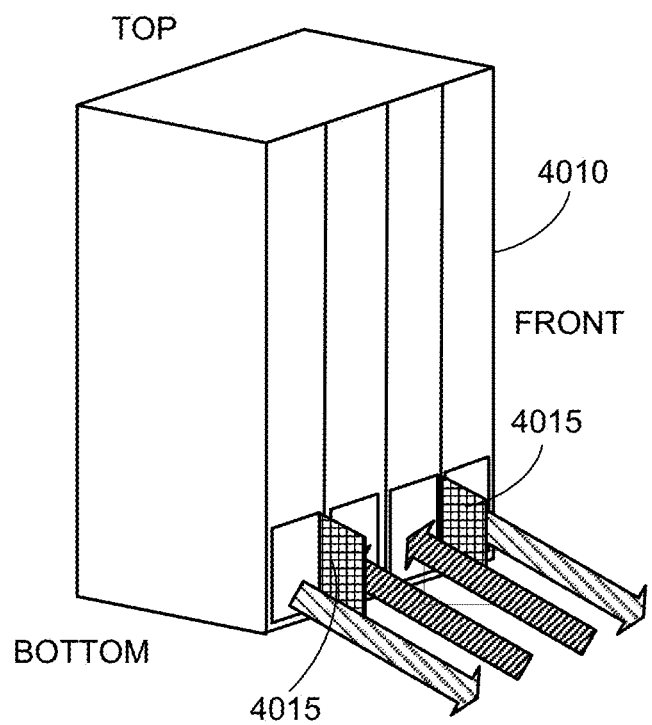
FIGS. 4A and 4B illustrate external air baffles/deflectors located between the inlet and outlet sections of the opening in the cabinet.
Figure 4B:
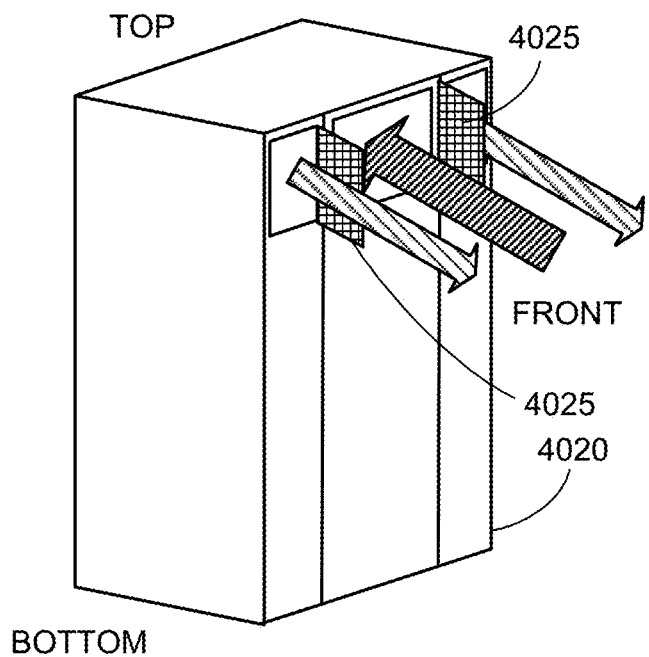
Figure 5B:
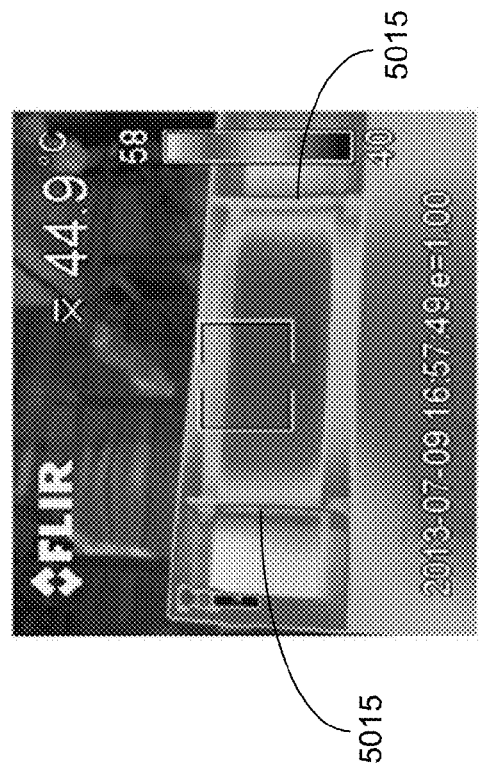
FIGS. 5A and 5B illustrate the cooling effect of using the external air baffles/deflectors.
Figure 5A:

The opening of the cabinet can further be provided with external baffles/deflectors mounted on the outside of the cabinet separating the inlet section from the two outlet sections. FIGS. 4A and 4B illustrate more in detail the construction of the baffles/deflectors. FIG. 4A illustrates the baffles 4015 where the opening is located in the lower part of the cabinet 4010. FIG. 4B illustrates the baffles 4025 for an opening located in the upper part of the cabinet 4020. These baffles/deflectors 4015,4025 contribute to the cooling effect. An example of this is shown by measurements illustrated in FIGS. 5A (without baffles) and 5B (with baffles) 5015.

Although the embodiments described above are mainly conceived for cooling base station transceivers, the concept can be used for cooling other electronic equipment such as radio access controllers, routers, servers etc.

The invention claimed is:

1. A thermal management cabinet for electronic equipment comprising:
    a cabinet frame having side walls and defining a front, a back, a top and a bottom, the cabinet forming a generally sealed enclosure for electronic equipment;
    an electronic component storage area including at least one rack mounting assembly for supporting electronic equipment in an interior section of the cabinet;
    one inlet section and two outlet sections;
    a fan assembly arranged to force and direct an incoming air flow entering through the inlet section of the opening of the cabinet so it can pass through the electronic component storage area and exit through the outlet sections;
    a first and a second elongated compartment wherein the first compartment is arranged to guide the air flow upwards and the second compartment being adjacent to the first compartment is arranged to guide the air flow downwards;
        wherein the inlet section and two outlet sections are co-located forming one opening in the cabinet and wherein the inlet section is located between the two outlet sections and wherein the cabinet further comprises:
            a first baffle assembly arranged to divide the incoming air flow received through the inlet section into two air flows so that each one of the two air flows can exit through one of the two outlet sections of the opening; and,
            a second baffle assembly comprising two baffles on the outside of the cabinet separating the inlet section from the two outlet sections.

2. A thermal management cabinet as recited in claim 1, wherein the opening is located in the upper part of the cabinet.

3. A thermal management cabinet as recited in claim 1, wherein the opening is located in the lower part of the cabinet.

4. A base station comprising a thermal management cabinet as recited in claim 1, and transceiver equipment mounted in the electronic component storage area within the cabinet.

* * * * *